United States Patent
Nikolaev et al.

(10) Patent No.: US 9,586,704 B2
(45) Date of Patent: Mar. 7, 2017

(54) MODELING THE LONG-TERM EVOLUTION OF SPACE DEBRIS

(71) Applicant: Lawrence Livermore National Security, LLC, Livermore, CA (US)

(72) Inventors: Sergei Nikolaev, Sacramento, CA (US); Willem H. De Vries, Livermore, CA (US); John R. Henderson, Castro Valley, CA (US); Matthew A. Horsley, Danville, CA (US); Ming Jiang, Dublin, CA (US); Joanne L. Levatin, Livermore, CA (US); Scot S. Olivier, Livermore, CA (US); Alexander J. Pertica, Livermore, CA (US); Donald W. Phillion, Dublin, CA (US); Harry K. Springer, Pleasanton, CA (US)

(73) Assignee: Lawrence Livermore National Security, LLC, Livermore, CA (US)

( * ) Notice: Subject to any disclaimer, the term of this patent is extended or adjusted under 35 U.S.C. 154(b) by 682 days.

(21) Appl. No.: 13/875,580

(22) Filed: May 2, 2013

(65) Prior Publication Data
US 2014/0330544 A1 Nov. 6, 2014

(51) Int. Cl.
*G06F 7/60* (2006.01)
*G06F 17/10* (2006.01)
(Continued)

(52) U.S. Cl.
CPC ............ *B64G 3/00* (2013.01); *G06F 17/5009* (2013.01); *G08G 5/0052* (2013.01); *G08G 9/02* (2013.01)

(58) Field of Classification Search
CPC .... B64G 3/00; G06F 17/5009; G08G 5/0052; G08G 9/02
(Continued)

(56) References Cited

U.S. PATENT DOCUMENTS 8,437,992 B2 * 5/2013 Bond ..................... A63F 13/10
703/6
8,612,196 B2 * 12/2013 Rosedale ............ G06F 17/5009
345/419
(Continued)

OTHER PUBLICATIONS

Bowman, B.R. and Tobiska, W.K., et al., "A New Empirical Thermospheric Density Model JB2008 Using New Solar and Geomagnetic Indices," *AIAA/AAS Astrodynamics Specialist Conf.*, Honolulu, HI, AIAA 2008-6438 (2008).
(Continued)

*Primary Examiner* — Aniss Chad
(74) *Attorney, Agent, or Firm* — Perkins Coie LLP

(57) ABSTRACT

A space object modeling system that models the evolution of space debris is provided. The modeling system simulates interaction of space objects at simulation times throughout a simulation period. The modeling system includes a propagator that calculates the position of each object at each simulation time based on orbital parameters. The modeling system also includes a collision detector that, for each pair of objects at each simulation time, performs a collision analysis. When the distance between objects satisfies a conjunction criterion, the modeling system calculates a local minimum distance between the pair of objects based on a curve fitting to identify a time of closest approach at the simulation times and calculating the position of the objects at the identified time. When the local minimum distance satisfies a collision criterion, the modeling system models the debris created by the collision of the pair of objects.

20 Claims, 8 Drawing Sheets

(51) Int. Cl.
*B64G 3/00* (2006.01)
*G06F 17/50* (2006.01)
*G08G 9/02* (2006.01)
*G08G 5/00* (2006.01)

(58) Field of Classification Search
USPC .......................................................... 703/2
See application file for complete search history.

(56) References Cited

U.S. PATENT DOCUMENTS

2006/0149516 A1\* 7/2006 Bond ..................... A63F 13/10
703/6
2007/0236502 A1\* 10/2007 Huang .................... G06T 19/00
345/473

OTHER PUBLICATIONS

Kessler, D. J. and Cour-Palais, B. G., "Collision Frequency of Artificial Satellites: The Creation of a Debris Belt," *J. of Geophysical Research* 83:63 (1978).
Liou, J. C., "An Updated Assessment of the Orbital Debris Environment in LEO," *Orbital Debris Quarterly News*, vol. 14, issue 1 (2010).
Springer, H. K., Miller, W. O., Levatin, J. L., Pertica, A. J., and Olivier, S. S., "Satellite Collision Modeling with Physics-Based Hydrocodes: Debris Generation Predictions of the Iridium-Cosmos Collision Event and Other Impact Events," *Proceedings of the 11th Annual Advanced Maui Optical and Space Surveillance Technologies Conference*, Wailea, HI (2010).

\* cited by examiner

MODELING THE LONG-TERM EVOLUTION OF SPACE DEBRIS

STATEMENT REGARDING FEDERALLY SPONSORED RESEARCH

The United States Government has rights in this invention pursuant to Contract No. DE-AC52-07NA27344 between the U.S. Department of Energy and Lawrence Livermore National Security, LLC, for the operation of Lawrence Livermore National Laboratory.

BACKGROUND

Thousands of satellites have been launched into earth orbit, with nearly 1,000 of them still active and providing valuable services such as military and intelligence data collection, global positioning, telecommunications, weather and climate monitoring, and so on. These active satellites, however, are increasingly at risk of colliding with "space junk," also referred to as "space debris." Space junk ("junk objects") is the collection of now-useless, human-created objects in earth orbit such as spent rocket stages, defunct satellites, mission-related debris, and fragments from collisions and on-orbit breakups. The risk of a collision occurring is more than a theoretical possibility as in February 2009 a collision occurred between an American Iridium satellite and a defunct Russian Cosmos satellite.

The risk of future collisions occurring is increasing because the density of objects in earth orbit is increasing. Although space junk will eventually be removed from orbit by the frictional forces of the earth's atmosphere, space junk can remain in orbit a very long time as those frictional forces are small. Space objects (e.g., active satellites and space junk) of certain types tend to orbit in certain orbital regions. For example, low-earth orbit (i.e., 160 km to 2,000 km) contains space stations, upper rocket stages, and amateur satellites; middle-earth orbit (2,000 km to 35,876 km) contains navigation satellites; and geostationary-earth orbit (36,000 km) contains geostationary satellites. Eventually, some orbital regions may become so crowded that placing new satellites in orbit will be impractical as the risk of a collision will be too high.

Estimates place the number of junk objects at tens of millions. The vast majority of the junk objects are very small particles such as dust from solid rocket motors or paint that flakes off of satellites. A collision between an active satellite and such small junk objects can have an erosive effect, similar to sandblasting, on the satellite. Estimates place the number of junk objects in low-earth orbit that are larger than 1 cm to be around 300,000. A collision between an active satellite and such junk objects can have a more serious effect, but not necessarily a catastrophic effect. A significant number of junk objects, however, are larger than 5 cm, and a collision between an active satellite and such large space junk can indeed be catastrophic.

A collision between large space objects (e.g., an active satellite and large space junk) may result in the creation of hundreds or thousands of fragments, some of which could be larger than a softball. The collision between the Iridium satellite and the Cosmos satellite produced thousands of junk objects that are still in orbit. Actions taken by certain countries have resulted in significantly increasing the amount of space junk. In 2007, China performed an anti-satellite weapons test that destroyed an aging weather satellite using a kill vehicle launched on board a ballistic missile. The destruction of the weather satellite created 2,000 baseball-sized or larger junk objects that could destroy a satellite and over 2 million junk objects that could cause damage to a satellite.

Once a collision between large space objects occurs, the likelihood of additional collisions occurring increases because of the new space junk created by the breakup of the space objects. If new space junk collides with a large space object, then even more space junk may be created, further increasing the probability of more collisions. This "collision cascading" problem is referred to as the "Kessler Syndrome." Kessler characterized this problem using analytic calculations using density of objects as a function of altitude to represent the low-earth orbit ("LEO") environment. (See Kessler, D. J. and Cour-Palais, B. G., "Collision Frequency of Artificial Satellites: The Creation of a Debris Belt," J. of Geophysical Research 83:63 (1978), which is hereby incorporated by reference.) Recently, NASA implemented a debris evolutionary model referred to as "LEGEND" to study the debris environment over the long term. (See Liou, J. C., "An Updated Assessment of the Orbital Debris Environment in LEO," Orbital Debris Quarterly News, vol. 14, issue 1 (2010), which is hereby incorporated by reference.) Although LEGEND propagates individual objects, it evaluates collisions at coarse sampling intervals. However, because of this coarseness, LEGEND may miss collisions that occur in between the sampling times. The rate of collisions cannot be scaled up by a ratio of sampling intervals as the rate of collisions is non-linear due to collision cascading.

Many applications can benefit from the accurate modeling of the evolutionary environment of space junk. One application is the analysis of various techniques to minimize space junk such as including a mechanism on a booster rocket to speed up its deorbit after being spent. Accurate modeling of space junk can be used to predict the effect of these techniques on the overall risk of collision, which can be used in a cost/benefit analysis. Another application is the assessing of the risk of collision for purposes of insuring a satellite. Accurate modeling can be used to aid in an actuarial analysis of the risk of loss of the satellite. Another application is performing a cost/benefit analysis of various potential orbits for a satellite. Accurate modeling may indicate that an orbit that is slightly suboptimal for the primary function of the satellite should be used because the risk of collision is significantly less than an orbit that is optimal. It would be desirable to accurately model the evolution of space junk over a long term (e.g., 100 years) to analyze the effects of various assumptions (e.g., rapid deorbiting of spent booster rockets or increase in satellite launch frequency).

DETAILED DESCRIPTION

Figure 1:
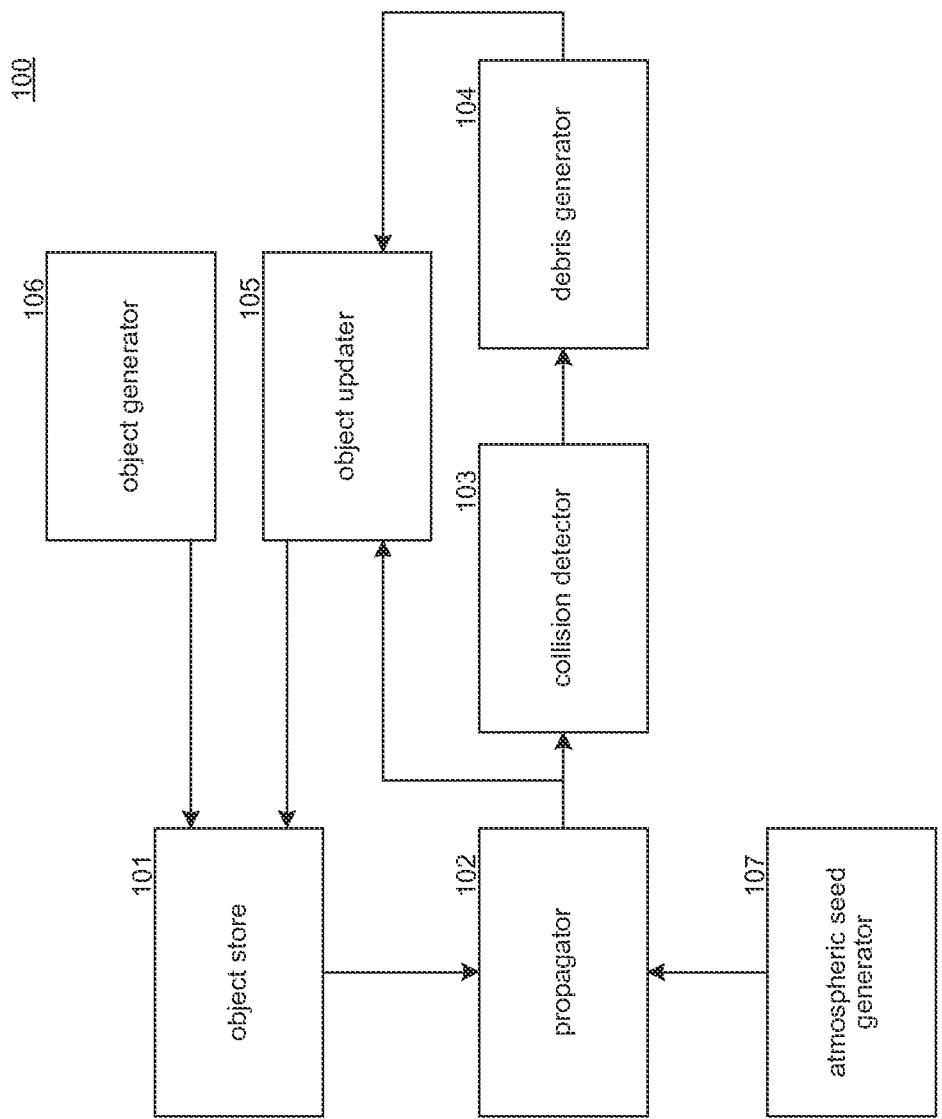
FIG. 1 is a block diagram that illustrates components of the SOM system in some embodiments.

A method and system to model the evolutionary trend in space debris based on various modeling assumptions is provided. In some embodiments, a space object modeling system ("the SOM system") simulates the interaction of objects (i.e., active satellites and space junk) in orbit during a simulation period (e.g., 100 years). The objects have initial orbital parameters (e.g., Keplerian elements) that can be used to determine the position of the objects at the start of the simulation period. The SOM system divides the simulation period into simulation steps (e.g., 22.5 seconds). For each simulation step, the SOM system calculates the position of each object based on its orbital parameters for a simulation time corresponding to that simulation step (e.g., simulation times of 22.5, 45, 67.5, 90, etc.). The SOM system then performs a collision analysis for that simulation time based on the calculated positions of the objects. The SOM system performs the collision analysis by, for each pair of objects, performing a collision computation that calculates the distance between the objects of the pair based on their calculated positions. Because the objects travel at a high rate of speed, the conjunctions of objects that occur in between the simulation times may be completely missed. To help ensure that such conjunctions are not missed, the SOM system uses interpolation to calculate the minimum distance between a pair of objects in between the simulation times. To calculate the minimum distance, the SOM system determines when objects of a pair are separated by a local minimum distance at a simulation time. For example, at three successive simulation times, objects may be 100, 25, and 125 meters apart, respectively. The distance of 25 meters represents a local minimum distance as the objects are farther apart at the previous simulation time and at the next simulation time. The SOM system interpolates from these distances and simulation times the time of the actual local minimum distance between the pair of objects in between the simulation times. The SOM system calculates the position of the objects at the time of the actual local minimum distance and then calculates the actual local minimum distance based on the calculated positions. When the actual local minimum distance satisfies a collision criterion (e.g., less than the sum of radii of the objects), the SOM system indicates that a collision has occurred. When a collision has occurred, the SOM system creates new objects representing debris resulting from the collision. The SOM system establishes orbital parameters for the new objects and indicates that the pair of objects is no longer in orbit. Because the SOM system simulates when collisions between objects will occur and simulates the debris that is generated from the collisions, the SOM system can accurately model the long-term evolutionary trend in space junk.

In some embodiments, the SOM system factors in the launching of new objects and the spontaneous breakup of objects during the simulation period. The number and the timing of the launchings of new objects may be an input parameter to the SOM system. The number and timing may be derived from historical launching patterns adjusted to account for anticipated changes in launch frequencies and scheduled launches. The number and timing may also factor in potential launches to assess the risks associated with launching at those times. Because some types of objects are susceptible to spontaneous breakup, the SOM system may model those breakups. An object can break up for several reasons. For example, the fuel in a thruster used for orbital adjustments may explode or a solar panel for a satellite may overheat and cause the panel to break away from the satellite. The SOM system may use a statistical model, which may be based on historical information, to factor in spontaneous breakups into the simulation.

In some embodiments, the SOM system factors in the effects of atmospheric drag on the orbit of objects based on an atmospheric model. One such atmospheric model is the JB2008 model. (See Bowman, B. R. and Tobiska, W. K., et al., "A New Empirical Thermospheric Density Model JB2008 Using New Solar and Geomagnetic Indices," AIAA/AAS Astrodynamics Specialist Conf., Honolulu, Hi., AIAA 2008-6438 (2008), which is hereby incorporated by reference.) The SOM system may estimate atmospheric drag based on position of the simulation time within the 11-year solar cycle. The SOM system may provide a model of the solar cycle. However, since the actual solar activity will vary considerable from the modeled solar activity, the SOM system allows the modeling of random fluctuations in the solar activity. The simulation for the entire simulation period may be performed many times assuming different random fluctuations in solar activity (a Monte Carlo approach) for each simulation. The results of these simulations provide a statistical distribution for the long-term evolution of space junk.

In some embodiments, when a collision occurs during the simulation, the SOM system simulates the debris using a hydrodynamic breakup model. One such breakup model is described in Springer, H. K., Miller, W. O., Levatin, J. L., Pertica, A. J., and Olivier, S. S., "Satellite Collision Modeling with Physics-Based Hydrocodes: Debris Generation Predictions of the Iridium-Cosmos Collision Event and Other Impact Events," Proceedings of the 11th Annual Advanced Maui Optical and Space Surveillance Technologies Conference, Wailea, Hi. (2010), which is hereby incorporated by reference. The satellites may be modeled as nested shells-cubic or spherical-of different combinations of materials such as aluminum, plastic, steel, and titanium. The SOM system uses thicknesses of shells to mimic the characteristics of typical satellites, such as average density and area-to-mass ratio. The SOM system may use the actual location of the debris as generated by the breakup model when performing the collision analysis for a number of simulation times after the breakup. Once the orbital parameters are generated for the debris, the SOM system processes the debris as any other space object.

In some embodiments, the SOM system requires vast amounts of computational resources to accurately model the evolution of space junk. The number of objects tracked may initially be on the order of 20,000. At each simulation time, the SOM system performs a collision computation between each of the 20,000 objects. Thus, the SOM system may perform on the order of $4 \times 10^8$ collision computations at each simulation time. As the simulation continues, the number of objects may increase dramatically as a result of new launches and breakups resulting in the performing of even more collision computations at each simulation time. In addition, since the simulation may cover a very large simulation period and the simulation steps need to be relatively small to ensure that collisions are not missed, the number of simulation times at which the collision computations need to be performed is very large. For example, if the simulation period is 100 years and the simulation step is 22.5 seconds, then the number of simulation times is approximately $1.5 \times 10^8$. As a result, the total number of collision computations that are needed is on the order of $6 \times 10^{16}$.

Because such a vast number of collision computations are needed, the SOM system may perform collision computations in parallel on a large number of processors (e.g., cores). To perform the collision computations in parallel, the SOM system divides the simulation period into simulation intervals. The SOM system performs the simulations for each simulation interval in sequence. However, the SOM system performs simulations within a simulation interval in parallel by dividing the simulation interval into processor intervals and assigning a different processor to perform the simulations for each different processor interval. For example, if the simulation interval is 10 days and the processor interval is 90 minutes, then the SOM system assigns a different processor interval to each of 160 processors. The processors perform the simulations in parallel for their assigned simulation intervals. After the simulations are complete, the SOM system updates orbital parameters and continues to the next simulation interval. Such parallelism is referred to as intra-simulation interval parallelism.

The simulations for a simulation interval can complete in parallel as long as no breakup occurs that could affect the simulation at a later processor interval of that simulation interval. For example, if a processor assigned to process the simulation for the 10th processor interval (out of the 160 processor intervals) detects a breakup, then the processing of the 150 processors assigned to the later processor intervals may need to be restarted to take into account debris generated by the breakup. For example, the SOM system may effectively restart the processing by defining the next simulation interval to start at the end of the processor interval that detected the breakup. As the simulation progresses, the number of objects can increase dramatically, resulting in a correspondingly dramatic increase in the number of the collision computations that need to be performed for each processor interval. Because the number of objects increases, the number of collisions will also increase, meaning that the processing of increasingly more processor intervals will need to be restarted, rendering more and more collision computations effectively wasted. To reduce such wasted computations, the SOM system may use a variable simulation interval with a fixed number of processor intervals. As the simulation progresses, the SOM system may decrease the simulation interval so that approximately the same number of collision computations are performed for each simulation interval regardless of the number of objects. For example, if the number of processor intervals is fixed at 160 and the simulation interval is decreased to 5 days, then the SOM system may decrease the processor interval to 45 minutes.

If sufficient processors are available, the SOM system may even perform the processing of a single processor interval in parallel by assigning a group of processors to a processor interval. The SOM system may assign a different set of objects to each processor of each processor group. Each processor is then responsible for performing the position computations for all the objects and the collision computations for the set of objects assigned to it in parallel with the processing of the other processors in the group. For example, if there are 10 processors in each group and 20,000 objects, then the SOM system assigns a set of 2000 objects to each processor. Each processor then performs the collision computation between each of those 2000 objects and the 19,999 other objects. Such parallelism is referred to as intra-processor interval parallelism.

In some embodiments, the SOM system uses Keplerian elements and their time derivatives as represented by the following equations to propagate the orbits of the objects:

$$\dot{i} \approx 0$$

$$\dot{\Omega} \approx -\frac{3}{2} n J_2 \left(\frac{a_e}{p}\right)^2 \cos i$$

$$\dot{\omega} \approx \frac{3}{4} n J_2 \left(\frac{a_e}{p}\right)^2 (4 - 5\sin^2 i)$$

$$\dot{M} \approx n \left[1 + \frac{3}{4} J_2 \left(\frac{a_e}{p}\right)^2 (2 - 3\sin^2 i)\sqrt{1 - e^2}\right]$$

The SOM system may only use the $J_2$ perturbation term in the elements to simplify their calculation, but may also use the sun and moon third-body perturbations for objects in geostationary-earth orbit. The SOM system may update the a_dot (ȧ) and e_dot (ė) values every simulation interval.

FIG. 1 is a block diagram in that illustrates components of the SOM system in some embodiments. The SOM system 100 includes an object store 101, a propagator 102, a collision detector 103, a debris generator 104, an object updater 105, an object generator 106, and an atmospheric seed generator 107. The object store, which may be a database or a flat file, includes an entry for each object that contains the orbital parameters for that object. The object store may be initialized based on the two-line element ("TLE") of orbiting elements as provided by NORAD. The object store may also include an estimated mass and size of each object. At each simulation time, the propagator calculates the position of each object in orbit for that simulation time and provides the position information to the collision detector and the object updater. At each simulation time, the collision detector determines whether a collision has occurred. If so, the collision detector provides an indication of the collision to the debris generator. The debris generator performs a hydrodynamic analysis of the collision to model the fragments created by the collision and their positions over time and provides the results of the analysis to the object updater. The object updater updates the object store to reflect changes in the orbital parameters of the objects, remove objects that are no longer in orbit, add objects created as a result of a collision, and so on. The object generator adds objects to the object store resulting from new launches and spontaneous breakups and removes objects as a result of spontaneous breakups and atmospheric reentries. The atmospheric seed generator generates a random number to introduce random fluctuations in the solar cycle. To introduce the fluctuations, the SOM system may use the seed to select the solar activity to be in the range of 7 days before or after the simulation time. The SOM system may generate new seeds at various times such as the beginning of each simulation interval.

The computer system on which the SOM system may be implemented may be a massively parallel processing system with nodes and with primary and secondary memory. The nodes may have multiple processors (e.g., cores or central processing units) and may have local memory and access to shared memory. Some of the nodes may be designated as service nodes with input devices such as keyboards and pointing devices, output devices such as display devices, and storage devices such as disk drives. The computer system may access computer-readable media that include computer-readable storage media and data transmission media. The computer-readable storage media are tangible media that include various memories such as primary memory, secondary memory, cache memory, and other storage mechanisms that may have recorded upon or may be encoded with computer-executable instructions or logic and data that implement the SOM system. The data transmission media is media for transmitting data using signals or carrier waves (e.g., electromagnetism) via a wire or wireless connection.

The SOM system may be described in the general context of computer-executable instructions, such as program modules, executed by one or more computers or other devices. Generally, program modules include routines, programs, objects, components, data structures, and so on that perform particular tasks or implement particular abstract data types. Typically, the functionality of the program modules may be combined or distributed as desired in various embodiments.

Figure 2:
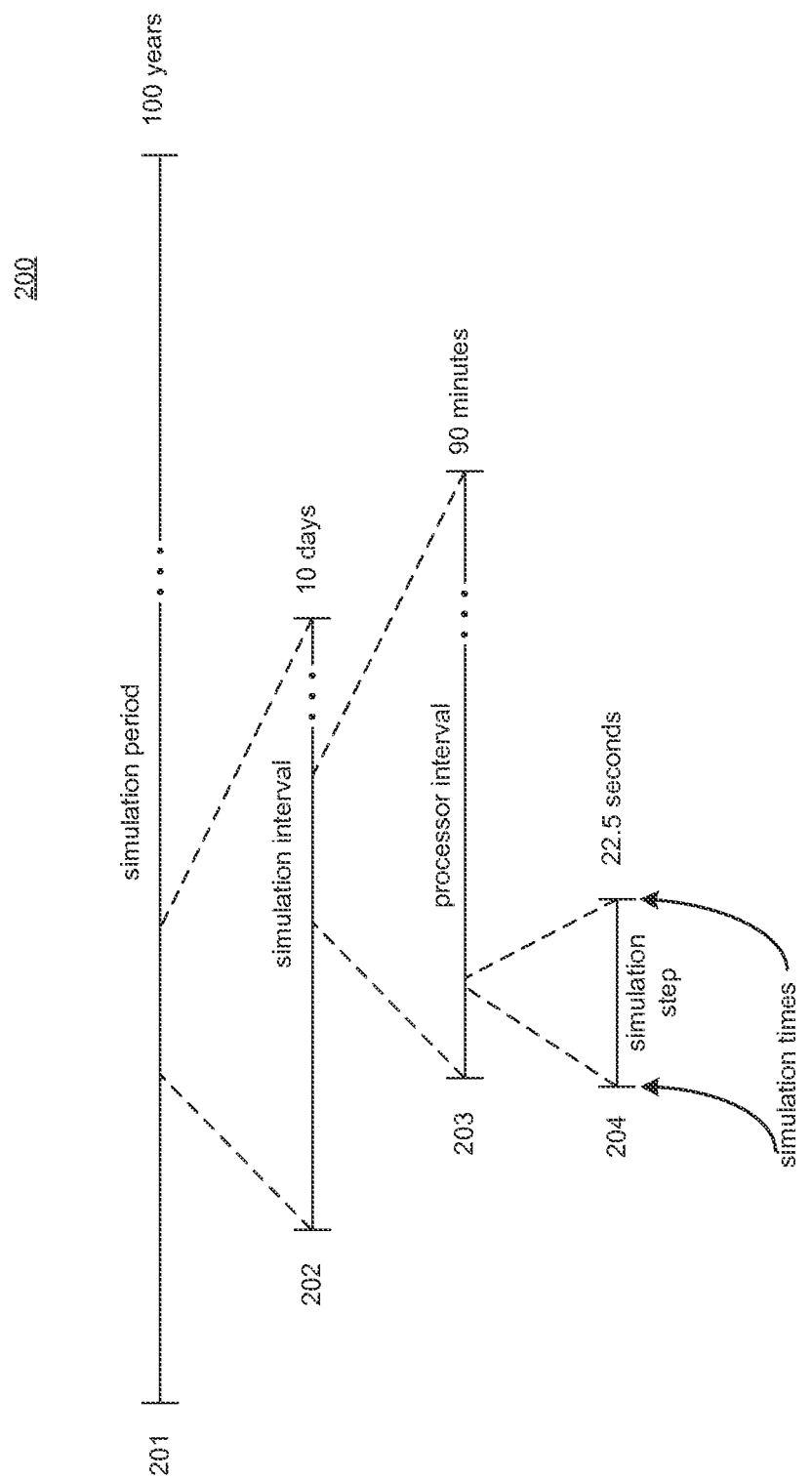
FIG. 2 is a diagram that illustrates the various time periods of the SOM system in some embodiments.

FIG. 2 is a diagram that illustrates the various time periods of the SOM system in some embodiments. The overall simulation may be performed for a simulation period 201 that is 100 years long. The simulation period may be divided into simulation intervals 202 that are 10 days long. A simulation interval that may be divided into processor intervals 203 that are 90 minutes long. As described above, the length of the simulation interval and processor interval may decrease as the number of collision computations increases. Similarly, the length of the intervals may increase when the number of collision computations decreases. A processor interval may be divided into simulation steps 204 that are 22.5 seconds long. The beginning of each simulation step corresponds to a simulation time at which the SOM system performs the simulation by propagating the position of the objects, performing the collision analysis, and modeling any collisions.

Figure 3:
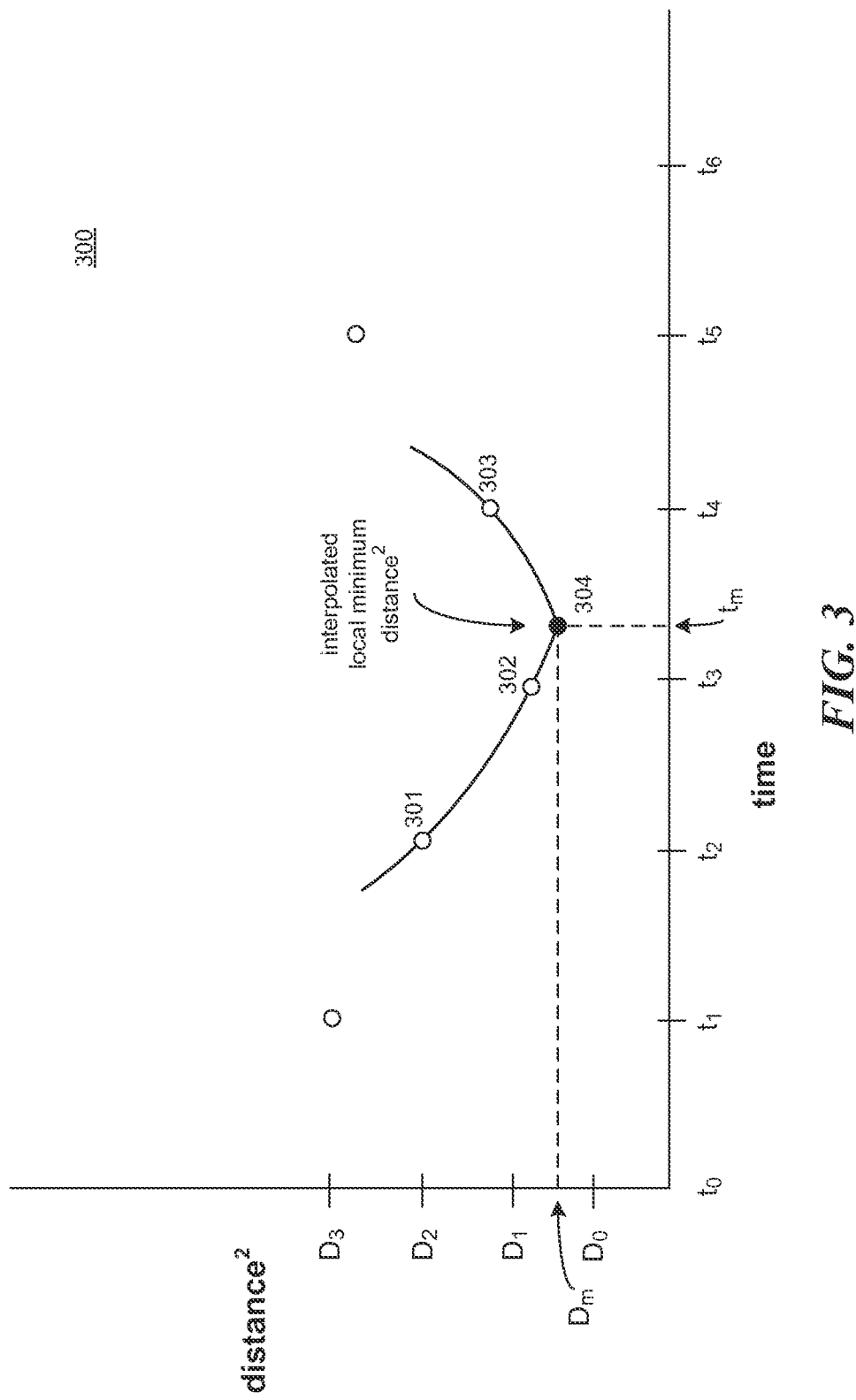
FIG. 3 is a diagram that illustrates an interpolation of the local minimum distance between objects in some embodiments.

FIG. 3 is a diagram that illustrates an interpolation of the local minimum distance between objects in some embodiments. The interpolation is performed based on the square of the distance between a pair of objects. A graph 300 has a y-axis representing distance squared and an x-axis representing time. The circles represent the distance squared between the objects at each simulation time. For example, at simulation time $t_2$, the distance squared between the objects is $D_2$. The distance squared at simulation time $t_3$ represents a local minimum of the distances because the distance between the objects is greater at both the previous simulation time $t_2$ and the next simulation time $t_4$. To interpolate, the SOM system performs a parabolic curve fitting based on points 301, 302, and 303. The SOM system determines the time $t_m$ of the point 304 at which the slope of the curve is zero. Once the time of the local minimum distance is determined, the SOM system calculates the position of the objects using the orbital parameters and then calculates actual local minimum distance based on the calculated positions. For collision detection purposes, the SOM system may model each object as a sphere. The SOM system detects a collision when the actual local minimum distance between a pair of objects is less than the sum of the radii of the objects.

Figure 4:
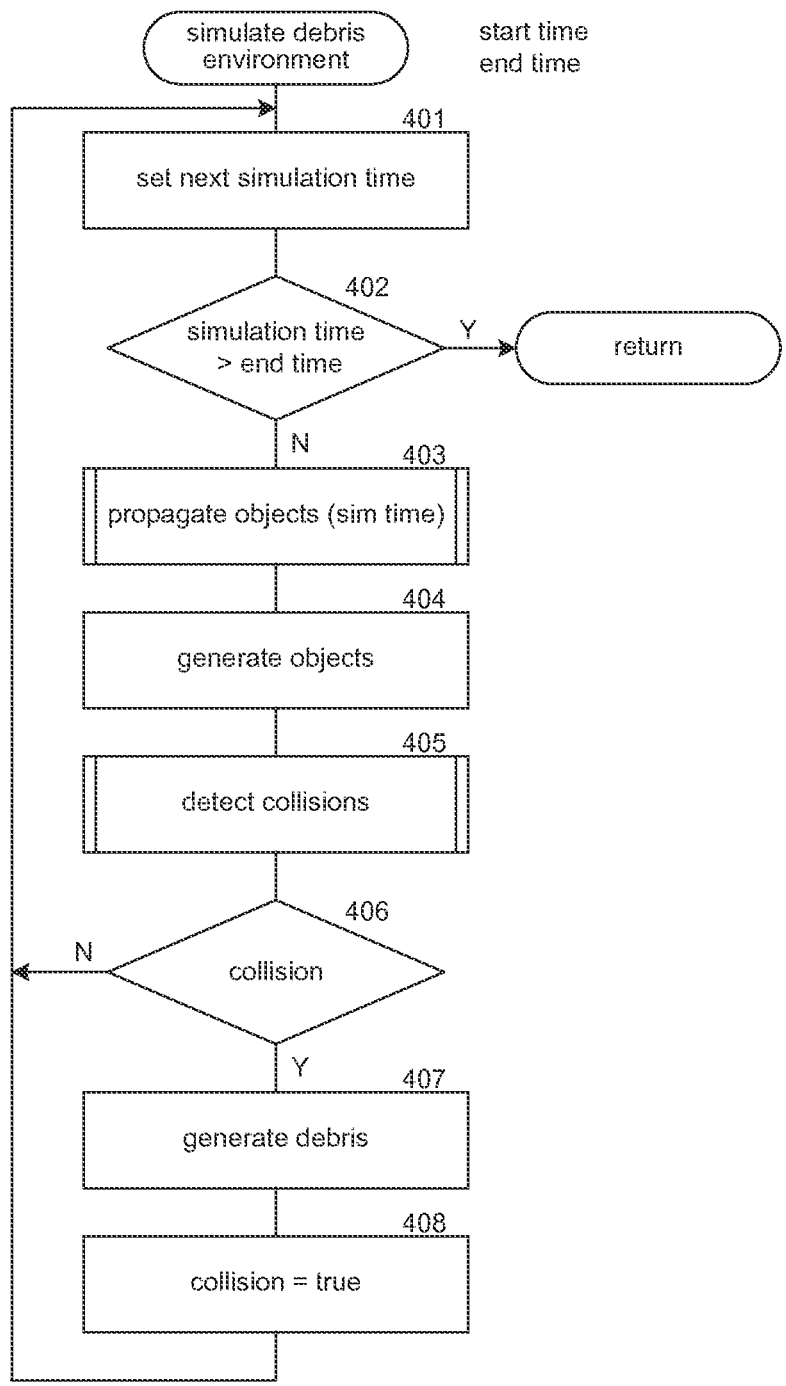
FIG. 4 is a flow chart that illustrates the processing of a simulate debris environment component of the SOM system in some embodiments.

FIG. 4 is a flow chart that illustrates the processing of a simulate debris environment component of the SOM system in some embodiments. The component performs the simulation for a simulation period identified by a start time and an end time. In blocks 401-408, the component loops performing the simulation at each simulation time within the simulation period. In block 401, the component selects the next simulation time by adding the simulation step to the previous simulation time. In decision block 402, if the simulation time is at the end of the simulation period, then the component completes, else the component continues at block 403. In block 403, the component invokes a propagate objects component to calculate the position of the object at the current simulation time. In block 404, the component generates new objects to reflect the new launches and spontaneous breakups. In block 405, the component invokes the detect collisions component to determine whether any of the objects have collided. In decision block 406, if a collision has occurred, then the component continues at block 407, else the component loops to block 401 to perform the simulation for the next simulation time. In block 407, the component generates the debris resulting from the collision of any objects that were detected to have collided using a hydrodynamic collision analysis. In block 408, the component sets a flag to indicate that a collision has occurred and then loops to block 401 to perform the simulation for the next simulation time. When the simulation is parallelized, the SOM system may use the flag to indicate that some of the processing needs to be performed again to factor in the collision.

Figure 5:
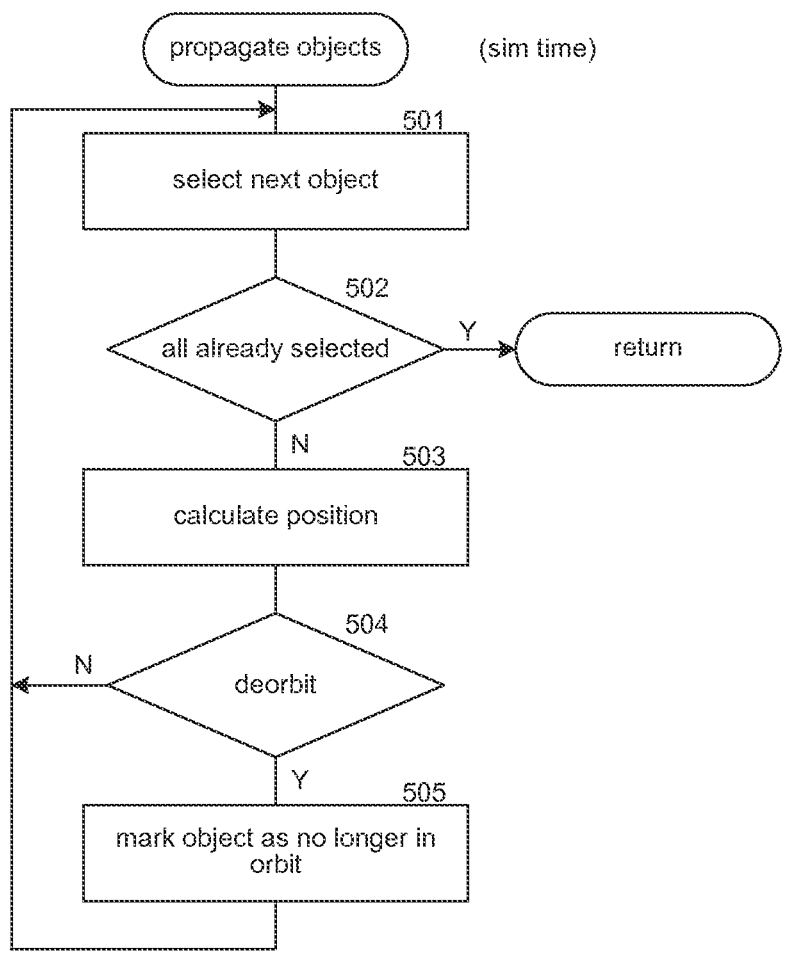
FIG. 5 is a flow diagram that illustrates the processing of a propagate objects component of the SOM system in some embodiments.

FIG. 5 is a flow diagram that illustrates the processing of a propagate objects component of the SOM system in some embodiments. The component is passed an indication of the simulation time and calculates the position of each of the objects at the simulation time. In block 501, the component selects the next object of the object store that is in orbit. In decision block 502, if all the objects have already been selected, then the component returns, else the component continues at block 503. In block 503, the component calculates the position of the selected object using the Keplerian elements factoring in the atmospheric drag as indicated by the position within the solar cycle. In decision block 504, if the selected object is determined to no longer be in orbit, then the component continues at block 505, else the component loops to block 501 to select the next object. In block 505, the component marks the object as no longer being in orbit and then loops to block 501 to select the next object.

Figure 6:
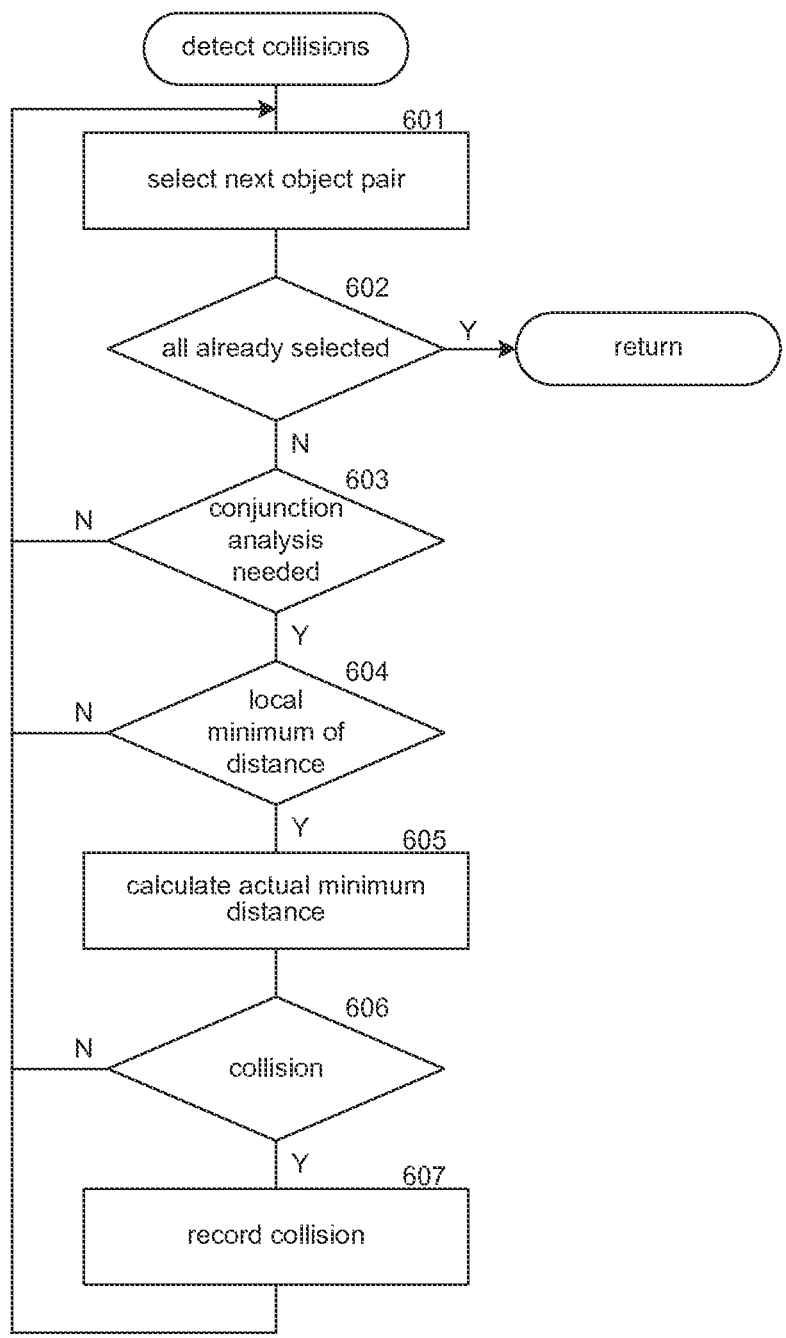
FIG. 6 is a flow diagram that illustrates the processing of a detect collisions component of the SOM system in some embodiments.

FIG. 6 is a flow diagram that illustrates the processing of a detect collisions component of the SOM system in some embodiments. The component determines whether an object has collided with another object based on the calculated positions of the objects. In blocks 601-607, the component loops selecting pairs of objects and determining whether the objects have collided. In block 601, the component selects the next pair of objects. In decision block 602, if all the pairs have already been selected, then the component returns, else the component continues at block 603. In decision block 603, if a conjunction analysis is needed, then the component continues at block 604, else the component loops to select the next pair of objects. A conjunction analysis may not be needed if, for example, one of the objects is in low-earth orbit and the other object is in middle-earth orbit because the difference in orbits means there is no chance of them colliding. In decision block 604, if a conjunction criterion is satisfied, then the component continues at block 605, else the component loops to block 601 to select the next pair of objects. The conjunction criterion may be satisfied when a local minimum distance between the objects has been detected for the simulation times and that distance is small enough that the objects may have collided in between the simulation times. In block 605, the component calculates the actual local minimum distance based on interpolating the closest approach time as illustrated by FIG. 3. In decision block 606, if a collision has occurred, then the component continues at block 607, else the component loops to block 601 to select the next pair of objects. In block 607, the component records an indication that a collision occurred and then loops to block 601 to select the next pair of objects.

Figure 7:
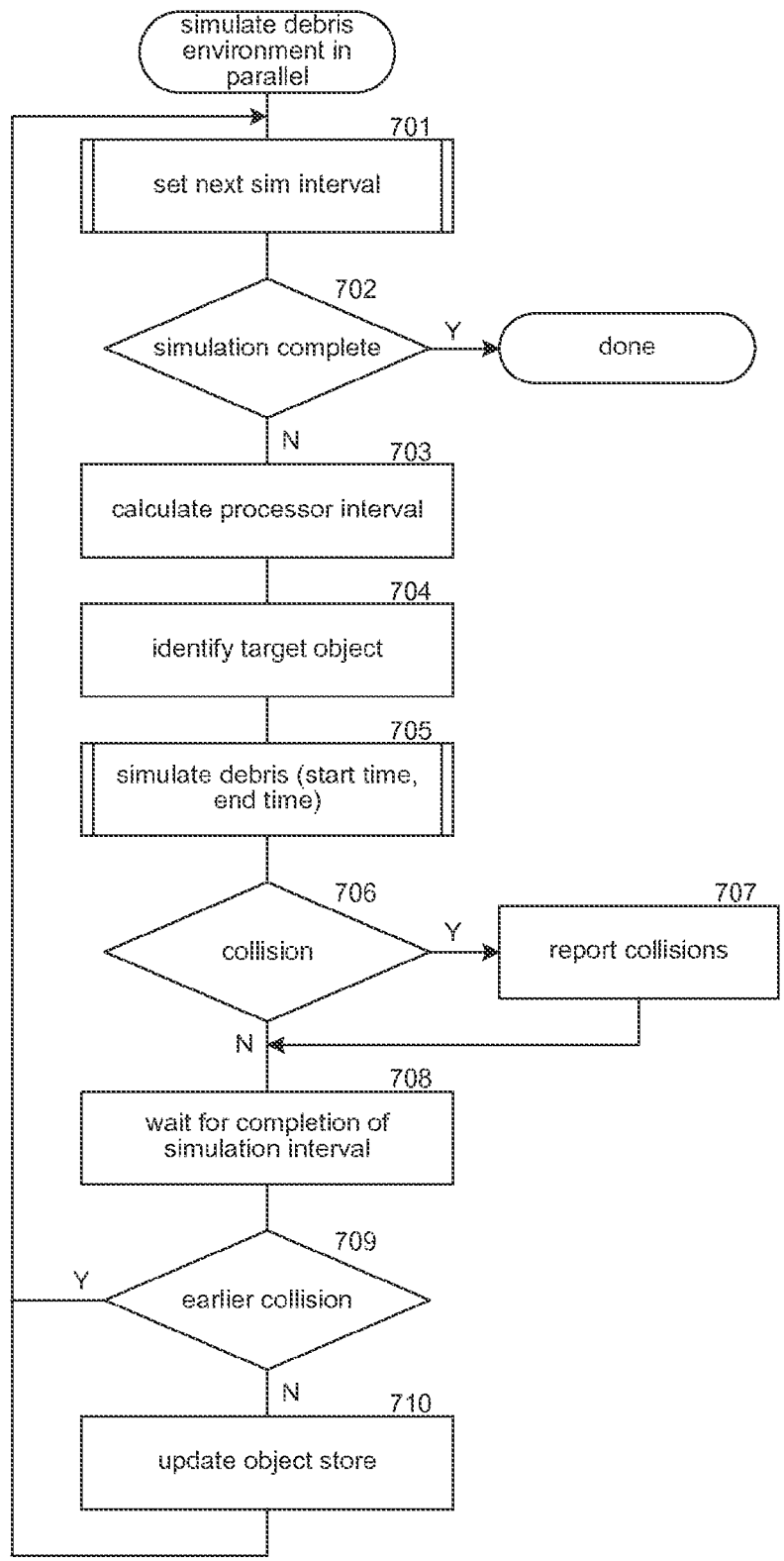
FIG. 7 is a flow diagram that illustrates parallelization of the simulate debris environment of the SOM system in some embodiments.

FIG. 7 is a flow diagram that illustrates parallelization of the simulate debris environment of the SOM system in some embodiments. A simulate debris environment in parallel component executes on each processor in each group assigned to a processor interval. Each processor may calculate the position of all objects for its assigned simulation time. A processor, however, performs the collision analysis only for a subset of the large objects. Since the number of conjunction computations is on the order of $N^2$, but the number of the position computations is on the order of N, the overhead of having each processor calculate the position of each object is small. As such, the SOM system may focus its intra-processor interval parallelization on the collision computations. Each processor may execute the same program with parameters controlling the assigned processor intervals and objects for the collision analysis. In block 701, the component invokes the set next simulation interval component to establish the simulation interval. In decision block 702, if the simulation interval is past the end of the simulation period, then the component completes, else the component continues at block 703. In block 703, the component calculates the processor interval to which the processor that is executing this component is assigned. In block 704, the component identifies as target objects those objects for which the processor that is executing this component is to perform the collision computations. In block 705, the component invokes the simulate debris environment component illustrated in FIG. 4. In decision block 706, if a collision is detected, then the component continues at block 707, else the component continues at block 708. In block 707, the component reports the collision so that the simulations for later processor intervals within the current simulation interval can be restarted. In block 708, the component waits for completion of the simulation by all the processors for the simulation interval. In decision block 709, if a collision was reported in an earlier processor interval, then the component does not update the object store and loops to block 701 to process the next simulation interval, else the component continues at block 710. In block 710, the component updates the object store and then loops to block 701 to select the next simulation interval.

Figure 8:
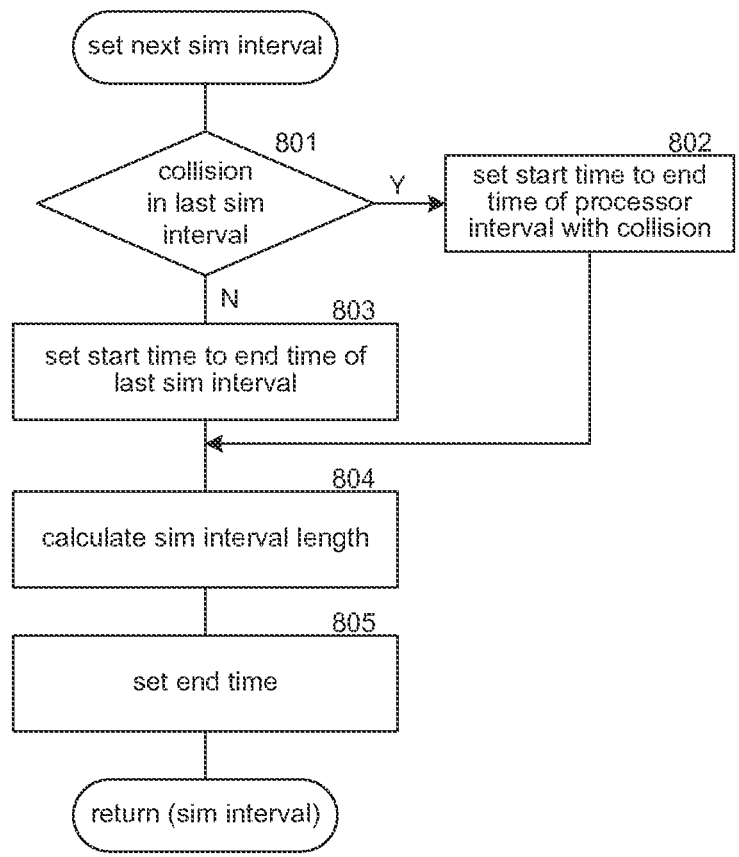
FIG. 8 is a flow diagram that illustrates the processing of the set next simulation interval component of the SOM system in some embodiments.

FIG. 8 is a flow diagram that illustrates the processing of the set next simulation interval component of the SOM system in some embodiments. The component determines the simulation interval, factoring in whether a collision occurred during the last simulation interval and the expected number of collision computations. In decision block 801, if there was a collision in the last simulation interval, then the component continues at block 802, else the component continues at block 803. In block 802, the component sets the start time of the simulation interval to the end time of the earliest processor interval that had a collision during the previous simulation interval. In block 803, the component sets the start time to the end time of the last simulation interval. In block 804, the component calculates the simulation interval length, factoring in the expected number of collision computations. In block 805, the component sets the end time of the simulation interval and then returns.

From the foregoing, it will be appreciated that specific embodiments of the invention have been described herein for purposes of illustration but that various modifications may be made without deviating from the scope of the invention. Accordingly, the invention is not limited except as by the appended claims.

We claim:

1. A method performed by a computing system for simulating interaction of objects in orbit during a simulation period, the objects having orbital parameters, the method comprising, for each of a plurality of simulation times during the simulation period,
   for each object, generating a representation of the object that includes a position for that object at that simulation time based on the orbital parameters; and
   for each pair of objects, performing a collision analysis by:
      determining by the computing system a distance between the pair of objects based on the generated positions; and
      detecting that a local minimum distance has been reached between the pair of objects;
      in response to detecting that a local minimum distance between the pair of objects has been reached,
         generating by the computing system an actual local minimum distance between the pair of objects by interpolating a time of the actual local minimum distance and calculating the position of the pair of objects at that time; and
         when the actual local minimum distance satisfies a collision criterion,
            creating by the computing system a representation of new objects corresponding to debris resulting from collision of the pair of objects; and
            generating by the computing system orbital parameters for the new objects and indicating that the pair of objects are no longer in orbit.

2. The method of claim 1 including creating representations of new objects corresponding to objects launched into orbit during the simulation period.

3. The method of claim 1 including creating representations of new objects corresponding to a spontaneous breakup of an object during the simulation period.

4. The method of claim 1 including removing a representation of an object when the position of the object indicates that the object is no longer in orbit.

5. The method of claim 1 wherein the generating of the position for an object factors in atmospheric drag on the object based on position within a solar cycle.

6. The method of claim 1 wherein the time of the actual local minimum distance is interpolated using parabolic curve fitting.

7. The method of claim 1 wherein the collision criterion is satisfied when the actual local minimum distance between the pair of objects is less than the sum of the radii of the objects.

8. The method of claim 1 wherein the creating of a representation of new objects and generating of orbital parameters is based on a hydrodynamic analysis of a collision of the pair of objects.

9. The method of claim 8 wherein physical characteristics of the objects are represented using nested cubes representing different types of materials.

10. The method of claim 1 wherein a plurality of processors perform processing in parallel at different simulation times.

11. The method of claim 10 wherein a group of processors perform the processing for a simulation time in parallel by having different processors of the group perform the collision analysis for different objects.

12. The method of claim 10 wherein when a collision is detected by a processor at a simulation time, results generated in parallel for later simulation times are disregarded.

13. A space object modeling system for simulating interaction of objects in orbit during a simulation period at simulation times, comprising:
an object store for storing representations of the objects that indicate orbital parameters of the objects;
a memory storing computer-executable instructions of:
a propagator that calculates the position of each object at each simulation time based on the orbital parameters and estimated atmospheric drag; and
a collision detector that, for each pair of objects at each simulation time, performs a collision analysis that
determines a distance between the pair of objects based on the calculated positions; and
detecting that a local minimum distance between the pair of objects has been reached;
in response to detecting that a local minimum distance between the pair of objects has been reached,
generates an actual local minimum distance between the pair of objects based on a curve fitting of distances at the simulation times; and
when the actual local minimum distance satisfies a collision criterion,
creates a representation of new objects corresponding to debris resulting from collision of the pair of objects; and
generates orbital parameters for the new objects and indicates that the pair of objects are no longer in orbit; and
a processor for executing the computer-executable instructions stored in memory.

14. The system of claim 13 including an object creator that creates representations of new objects corresponding to objects launched into orbit and a spontaneous breakup of an object during the simulation period.

15. The system of claim 13 wherein the propagator calculates the position for an object factoring in atmospheric drag on the object based on position within a solar cycle.

16. The system of claim 13 wherein the curve fitting is parabolic.

17. The system of claim 13 wherein the collision detector performs a hydrodynamic analysis of a collision to model the debris created by a collision.

18. The system of claim 13 wherein the space object modeling system executes on a plurality of processors to perform processing in parallel for different simulation times.

19. The system of claim 18 wherein a group of processors perform the processing for a simulation time in parallel by having different processors of the group perform the collision analysis for different objects.

20. A non-transitory computer-readable medium comprising instructions for controlling a computer system to simulate space debris during a simulation period, the instructions comprising:
propagator instructions that calculate the position of objects in orbit at simulation times based on orbital parameters of the objects; and
collision detector instructions that, for each pair of objects at each simulation time, perform a collision analysis that,
determines whether the calculated positions indicate that the distance between the objects satisfies a conjunction criterion, the conjunction criterion being satisfied when a local minimum distance has been reached between the pair of objects;
in response to determining that the calculated positions indicate that the distance between the objects satisfies the conjunction criterion, generates an actual local minimum distance between the pair of objects based on a curve fitting of distances at the simulation times; and
when the actual local minimum distance satisfies a collision criterion, models the debris created by the collision of the pair of objects by;
creating a representation of new objects corresponding to the debris resulting from a collision of the pair of objects; and
generating orbital parameters for the new objects to represent the orbits of the new objects; and
indicating that the pair of objects are no longer in orbit.

* * * * *